United States Patent
Youssef et al.

(10) Patent No.: US 9,723,560 B2
(45) Date of Patent: Aug. 1, 2017

(54) MULTI-STAGE AMPLIFIER WITH RC NETWORK

(71) Applicant: QUALCOMM Incorporated, San Diego, CA (US)

(72) Inventors: Ahmed Abdel Monem Youssef, San Diego, CA (US); Wingching Vincent Leung, San Diego, CA (US); Rui Xu, San Diego, CA (US); Udara Charman Fernando, San Diego, CA (US); Ketan Humnabadkar, San Diego, CA (US); Tsai-Chen Huang, San Diego, CA (US); Li-Chung Chang, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/638,963

(22) Filed: Mar. 4, 2015

(65) Prior Publication Data
US 2015/0341859 A1 Nov. 26, 2015

Related U.S. Application Data

(60) Provisional application No. 62/001,657, filed on May 22, 2014.

(51) Int. Cl.
| | |
|---|---|
| *H04B 1/04* | (2006.01) |
| *H04W 52/02* | (2009.01) |
| *H03F 3/19* | (2006.01) |
| *H03F 1/56* | (2006.01) |
| *H04B 1/00* | (2006.01) |

(Continued)

(52) U.S. Cl.
CPC .......... *H04W 52/0229* (2013.01); *H03F 1/56* (2013.01); *H03F 3/19* (2013.01); *H04B 1/005* (2013.01); *H04B 1/44* (2013.01); *H04B 1/48* (2013.01); *H03F 2200/294* (2013.01);
(Continued)

(58) Field of Classification Search
CPC ............. H04W 52/027; H04W 52/028; H04W 52/0261; H04W 52/0274; H04W 52/0232; H04W 52/0241; H04W 52/0245; H04W 88/00; H04W 88/06; H04W 52/0229
USPC ......... 455/127.3, 127.4, 141, 143, 144, 341, 455/342, 343
See application file for complete search history.

(56) References Cited

U.S. PATENT DOCUMENTS

| | | | |
|---|---|---|---|
| 6,909,882 B2 * | 6/2005 | Hayashi | ............... H03D 7/1433 375/141 |
| 6,914,479 B1 * | 7/2005 | Gabillard et al. | ............... 330/69 |

(Continued)

FOREIGN PATENT DOCUMENTS

WO         0215397 A2     2/2002

OTHER PUBLICATIONS

International Search Report and Written Opinion—PCT/US2015/029984—ISA/EPO—Jul. 20, 2015, 9 pages.

*Primary Examiner* — Jean Gelin
(74) *Attorney, Agent, or Firm* — Qualcomm Incorporated-Toler

(57) ABSTRACT

An apparatus includes a first amplifier stage configured to amplify a first carrier signal. The apparatus includes a second amplifier stage configured to amplify a second carrier signal. A resistive-capacitive (RC) network is coupled to the first amplifier stage and to the second amplifier stage. The RC network includes a resistive element coupled to a capacitive element.

20 Claims, 6 Drawing Sheets

(51) Int. Cl.
  *H04B 1/44*  (2006.01)
  *H04B 1/48*  (2006.01)
  *H04W 88/06*  (2009.01)

(52) U.S. Cl.
  CPC ....... *H03F 2200/451* (2013.01); *H04W 88/06* (2013.01); *Y02B 60/50* (2013.01)

(56) References Cited

U.S. PATENT DOCUMENTS

| | | | |
|---|---|---|---|
| 7,650,133 B2 * | 1/2010 | Miura ................... | H04B 1/48 327/404 |
| 7,650,134 B2 * | 1/2010 | Nakajima .............. | H04B 1/006 327/404 |
| 7,696,828 B2 | 4/2010 | Chang | |
| 8,385,872 B2 | 2/2013 | Muthali et al. | |
| 8,433,272 B2 | 4/2013 | Gudem et al. | |
| 8,509,290 B2 * | 8/2013 | Bellaouar ............ | H03G 3/3047 330/10 |
| 8,577,325 B2 | 11/2013 | Lee et al. | |
| 2009/0011727 A1 | 1/2009 | Nakamura et al. | |
| 2010/0066577 A1 * | 3/2010 | Huang .................. | H03F 1/0277 341/143 |
| 2010/0295379 A1 * | 11/2010 | Garcia .................... | H02J 7/345 307/109 |
| 2013/0031548 A1 | 1/2013 | Kurozumi | |
| 2013/0063223 A1 | 3/2013 | See et al. | |
| 2013/0107776 A1 | 5/2013 | Batchu et al. | |
| 2013/0136211 A1 * | 5/2013 | Jussila et al. ................. | 375/340 |
| 2013/0315348 A1 * | 11/2013 | Tasic et al. .................... | 375/340 |
| 2013/0316669 A1 * | 11/2013 | Davierwalla et al. ........ | 455/208 |
| 2013/0316670 A1 | 11/2013 | Tasic et al. | |
| 2014/0018026 A1 * | 1/2014 | Klepser et al. ............. | 455/230 |
| 2014/0038532 A1 * | 2/2014 | GEORGE et al. ............. | 455/78 |
| 2014/0134960 A1 | 5/2014 | Tasic et al. | |
| 2014/0213209 A1 * | 7/2014 | Holenstein et al. ........ | 455/253.2 |
| 2014/0253242 A1 | 9/2014 | Youssef et al. | |
| 2014/0348266 A1 * | 11/2014 | Yamanouchi .................. | 375/297 |
| 2015/0084688 A1 * | 3/2015 | Chang et al. ................. | 327/555 |

\* cited by examiner

MULTI-STAGE AMPLIFIER WITH RC NETWORK

I. CROSS-REFERENCE TO RELATED APPLICATION

The present application claims priority from U.S. Provisional patent application No. 62/001,657, filed May 22, 2014 and entitled "LOW NOISE AMPLIFIER (LNA) FOR DUAL RECEIVER DUAL SIM DUAL STANDBY (DSDS) OPERATION," the content of which is incorporated by reference in its entirety.

II. FIELD

The present disclosure relates generally to electronics, and more specifically to transmitters and receivers.

III. DESCRIPTION OF RELATED ART

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover information contained in the communication signal. The transceiver also includes circuitry that enables the transmission of a communication signal to a receiver in another transceiver. The transceiver may be able to operate over multiple frequency ranges, typically referred to as frequency bands. Moreover, a single transceiver may be configured to operate using multiple carrier signals that may be in the same frequency band, but that may not overlap in frequency, an arrangement referred to as non-contiguous carriers.

In some instances, a single transmitter or receiver is configured to operate using multiple transmit frequencies and/or multiple receive frequencies. For a receiver to be able to simultaneously receive two or more receive signals, two or more receive paths may be concurrently operated. Such systems are sometimes referred to as "carrier-aggregation" systems. The term "carrier-aggregation" may refer to systems that include inter-band carrier aggregation and intra-band carrier aggregation. Intra-band carrier aggregation refers to the processing of two separate carrier signals in the same communication band. Inter-band carrier aggregation refers to the processing of two separate carrier signals that are in different communication bands.

One of the possible uses for a transceiver having carrier-aggregation capability is the reception of multiple signals from different wireless networks that use different communication standards, for example, CDMA and GSM. Such a system is referred to as a dual subscriber identity module (SIM) dual standby (DSDS) system. One approach to achieve DSDS capability uses a main amplifier to support conventional CA operation of the LNA and an auxiliary high impedance amplifier to support receiving a DSDS paging signal. In conventional CA operation, the two carriers are assumed to be balanced with regard to receive power to a certain degree, but for DSDS operation the paging signal could be received from another base station in which case the two carriers CA1 and CA2 may have different power levels. The auxiliary LNA conventionally has a high input impedance relative to the main LNA to reduce the effect of the auxiliary LNA on the normal operation of the main LNA. Unfortunately, this requires that the main amplifier be on to preserve the input matching while the auxiliary high impedance amplifier is in use to receive the DSDS paging signal, even if there is no main receive signal. Power consumed by the main LNA when there is no main receive signal may reduce a useful battery life of a device.

IV. BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

V. DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may include files having executable content, such as: object code, scripts, byte code, markup language files, and patches. In addition, an "application" referred to herein, may also include files that are not executable in nature, such as documents that may need to be opened or other data files that need to be accessed.

The term "content" may include files having executable content, such as: object code, scripts, byte code, markup language files, and patches. In addition, "content" referred to herein, may also include files that are not executable in nature, such as documents that may need to be opened or other data files that need to be accessed.

As used herein, the term "stand-alone operation" refers to an amplifier, such as a low noise amplifier (LNA), operating on a single carrier signal at a time, and the term "simultaneous operation" refers to an amplifier, such as an LNA, operating on two or more carrier signals simultaneously.

Figure 1:
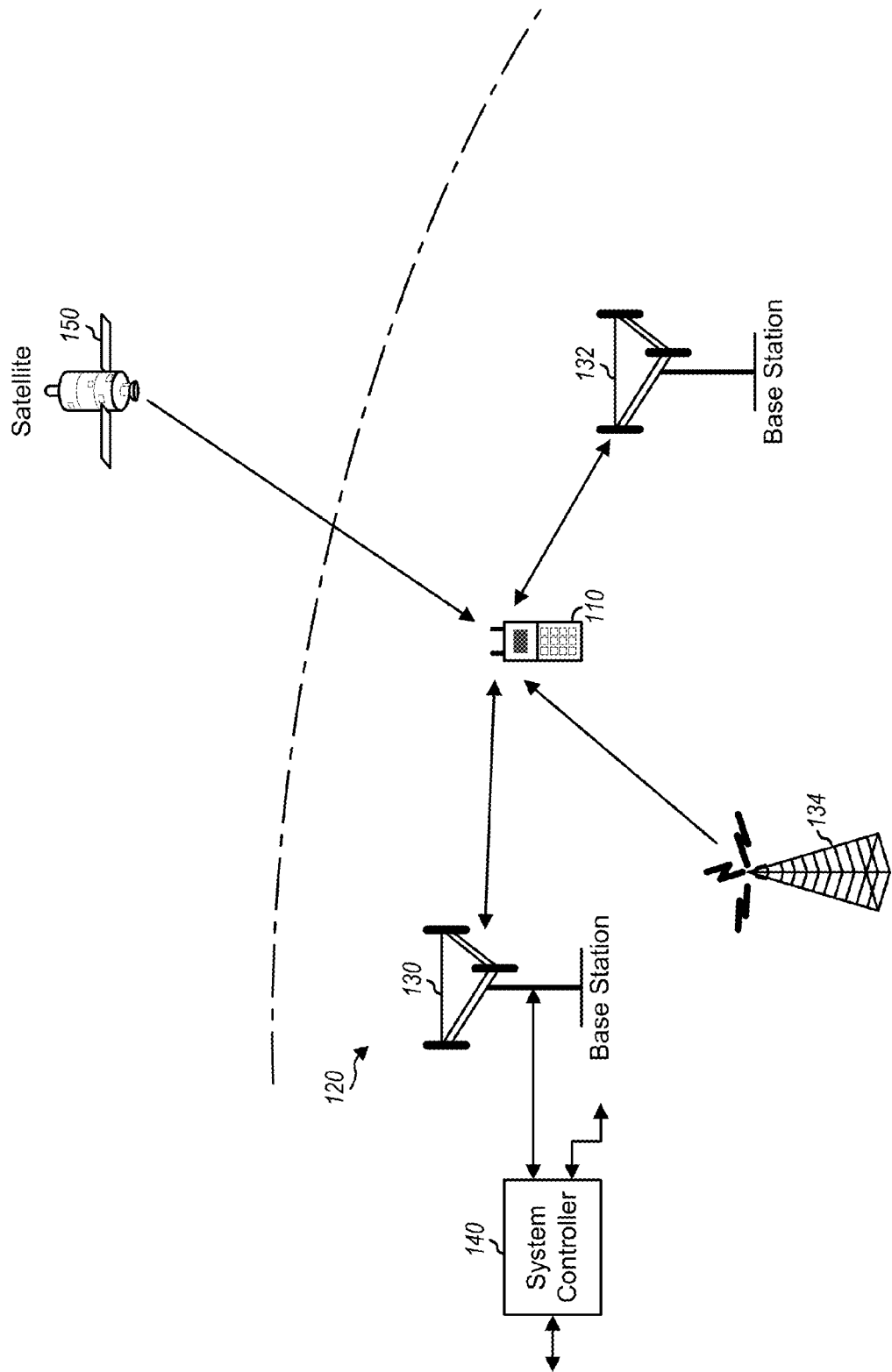
FIG. 1 is a diagram showing a wireless device communicating with a wireless communication system.

FIG. 1 is a diagram showing a wireless device 110 communicating with a wireless communication system 120.

The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Wireless device 110 may support carrier aggregation, which includes operation on multiple carriers. Carrier aggregation may also be referred to as multi-carrier operation. Wireless device 110 may be able to operate in a low-band (LB) frequency band group (e.g., a "band group" of one or more frequency bands in which a highest frequency included in the one or more frequency bands does not exceed 1000 megahertz (MHz)), a mid-band (MB) frequency band group (e.g., a band group of one or more frequency bands in which a lowest frequency included in the one or more frequency bands exceeds 1000 MHz and in which a highest frequency included in the one or more frequency bands does not exceed 2300 MHz), and/or high-band (HB) frequency band group (e.g., a band group of one or more frequency bands in which a lowest frequency included in the one or more frequency bands exceeds 2300 MHz). For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). In some implementations, each band may have a bandwidth that is smaller than or equal to 200 MHz and may include one or more carriers. Each carrier may cover up to 20 MHz in LTE. LTE Release 11 supports 35 bands, which are referred to as LTE/UMTS bands and are listed in 3GPP TS 36.101.

Figure 4:
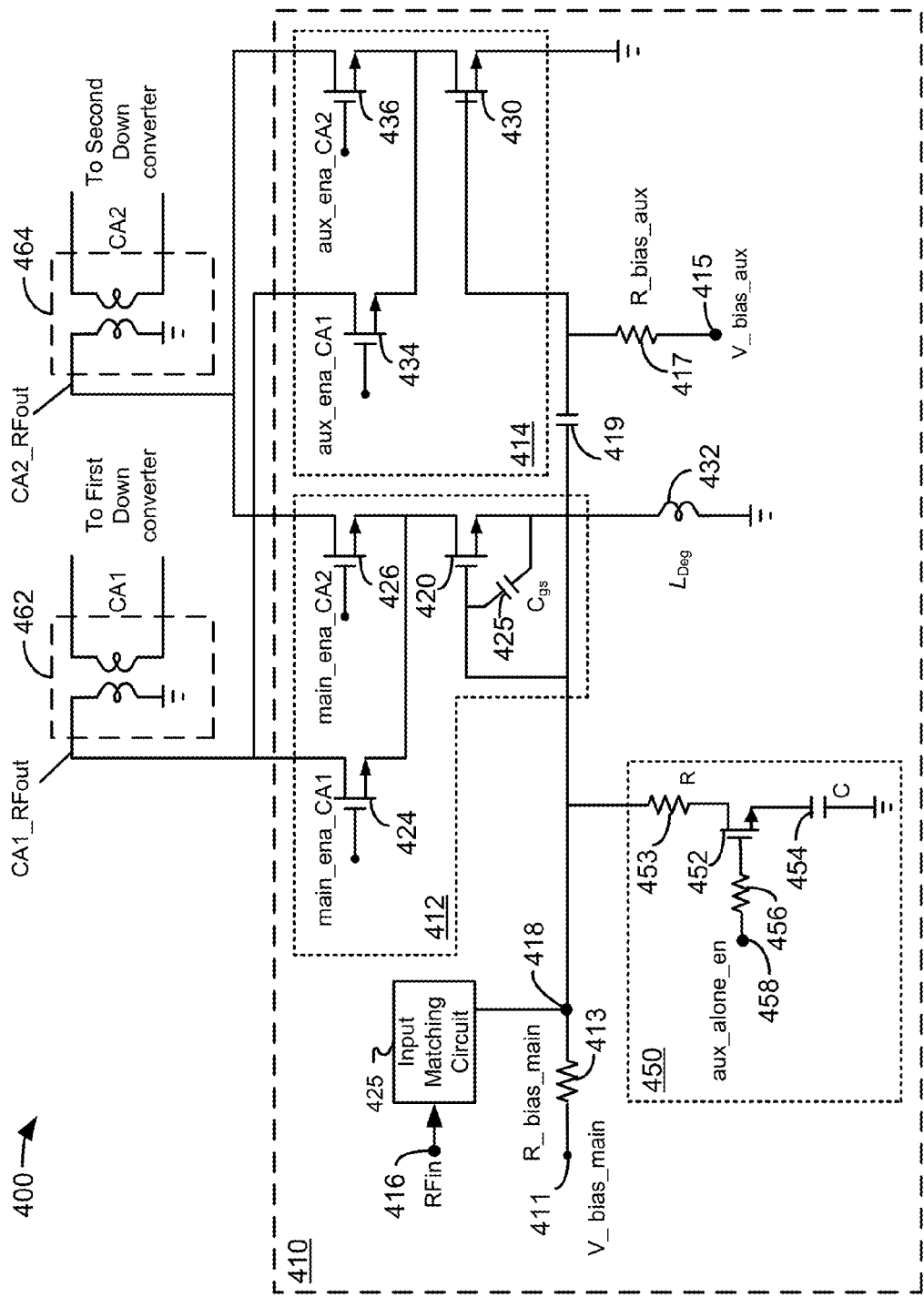
FIG. 4 illustrates an exemplary embodiment of an amplifier that may be included in the wireless device of FIG. 1.

Wireless device 110 may include an amplifier having a resistive-capacitive (RC) network, such as described in further detail with respect to FIG. 4. In a carrier aggregation mode of operation, the wireless device 110 may amplify different carrier signals at different amplifier stages. In a non-carrier aggregation mode of operation, the wireless device 110 may amplify a carrier signal at multiple amplifier stages that operate in parallel with each other. The RC network may include a switching device configured to selectively modify an input impedance of the amplifier based on a mode of operation, such as a carrier aggregation mode. In general, carrier aggregation (CA) may be categorized into two types—intra-band CA and inter-band CA. Intra-band CA refers to operation on multiple carriers within the same band. Inter-band CA refers to operation on multiple carriers in different bands. The wireless device 110 may support various carrier aggregation modes, such as inter-band and intra-band carrier aggregation, at a single amplifier that uses the RC network. As a result, a chip area and cost of the amplifier may be reduced as compared to amplifiers that use more complex matching networks.

FIG. 2A is a graphical diagram showing a low-band group 210, a mid-band group 212, a high-band group 214, and an example of contiguous intra-band carrier-aggregation (CA). In the example shown in FIG. 2A, wireless device 110 is configured with four contiguous carriers 216-219 in low-band. The wireless device 110 may send and/or receive transmissions on the four contiguous carriers 216-219 within the same band group. The wireless device 110 may include an LNA that has a first amplifier stage 202, a second amplifier stage 204, and an RC network 206. The amplifier stages 202, 204 may receive an input RF signal that includes a first carrier signal corresponding to the first carrier 216 and a second carrier signal corresponding to the second carrier 217. The first amplifier stage 202 is configured to amplify the first carrier signal and the second amplifier stage 204 is configured to amplify the second carrier signal. The second amplifier stage 204 operates in parallel with the first amplifier stage 202. As a result, the wireless device 110 may amplify a first portion of a received signal, the first portion corresponding to the first carrier 216, concurrently with amplifying a second portion of the received signal, the second portion corresponding to the second carrier 217.

FIG. 2B is a graphical diagram showing an example of non-contiguous intra-band CA. In the example shown in FIG. 2B, wireless device 110 is configured to send and/or receive wireless communications using four non-contiguous carriers in one band in the low-band group 210. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured to send and/or receive wireless communications using four carriers in two bands 220, 222 in the low-band group 210. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured to send and/or receive wireless communications using four carriers in two bands in different band groups, which include two carriers in one band in the low-band group 210 and two carriers in another band in the mid-band group 212. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
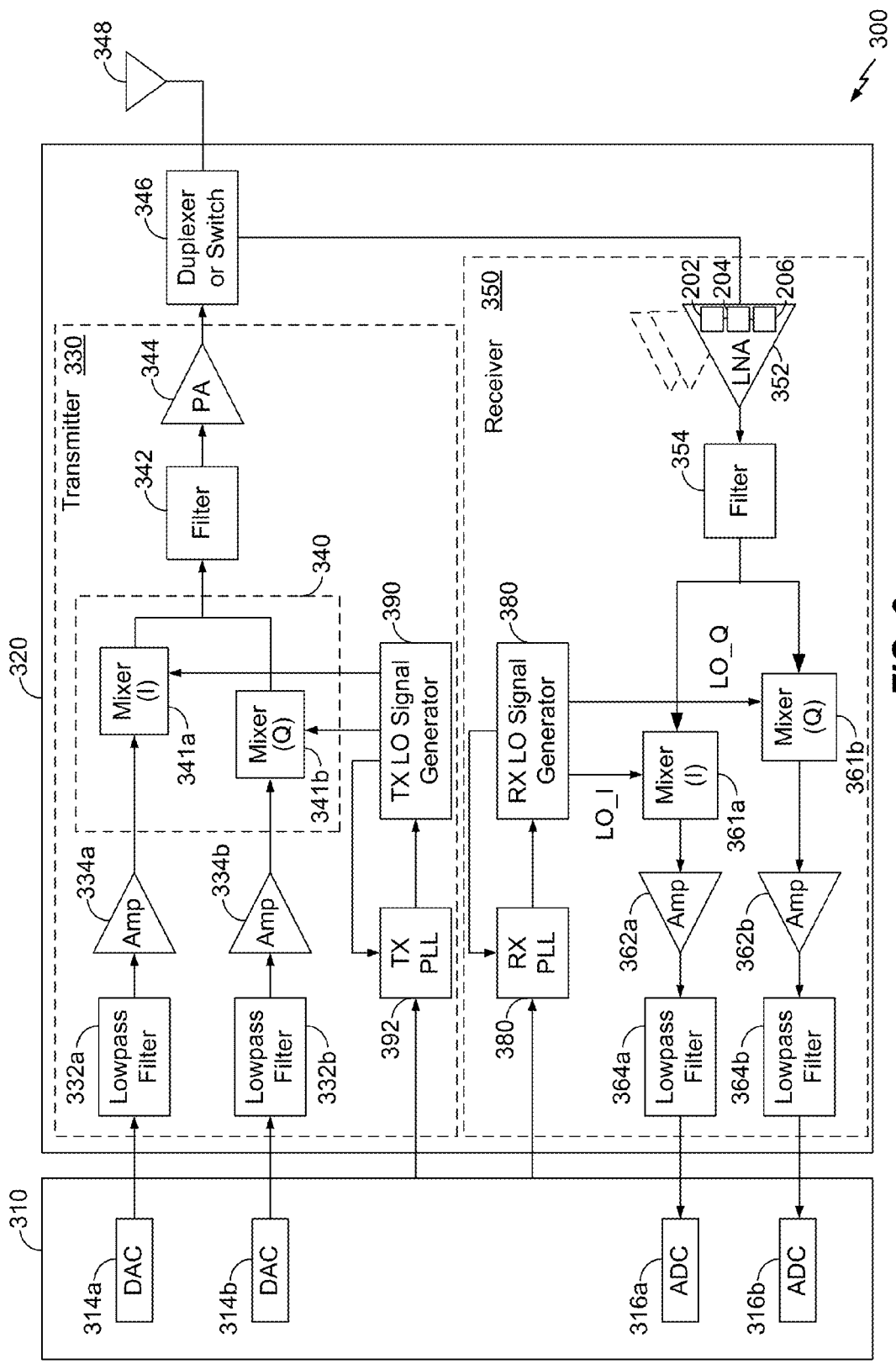
FIG. 3 is a block diagram showing components that may be included in the wireless device of FIG. 1.

FIG. 3 is a block diagram showing a wireless device 300 (e.g., an exemplary implementation of the wireless device 110 of FIG. 1). FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The LNA 352 may comprise a single LNA configured to operate on one or more carrier signals, either stand-alone or simultaneously. For example, the LNA 352 may include the first amplifier stage 202 coupled in parallel with the second amplifier stage 204 and the RC network 206 of FIG. 2. The LNA 352 may comprise two or more LNAs configured to operate on one or more carrier signals, either stand-alone or simultaneously.

The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers.

Figure 2:
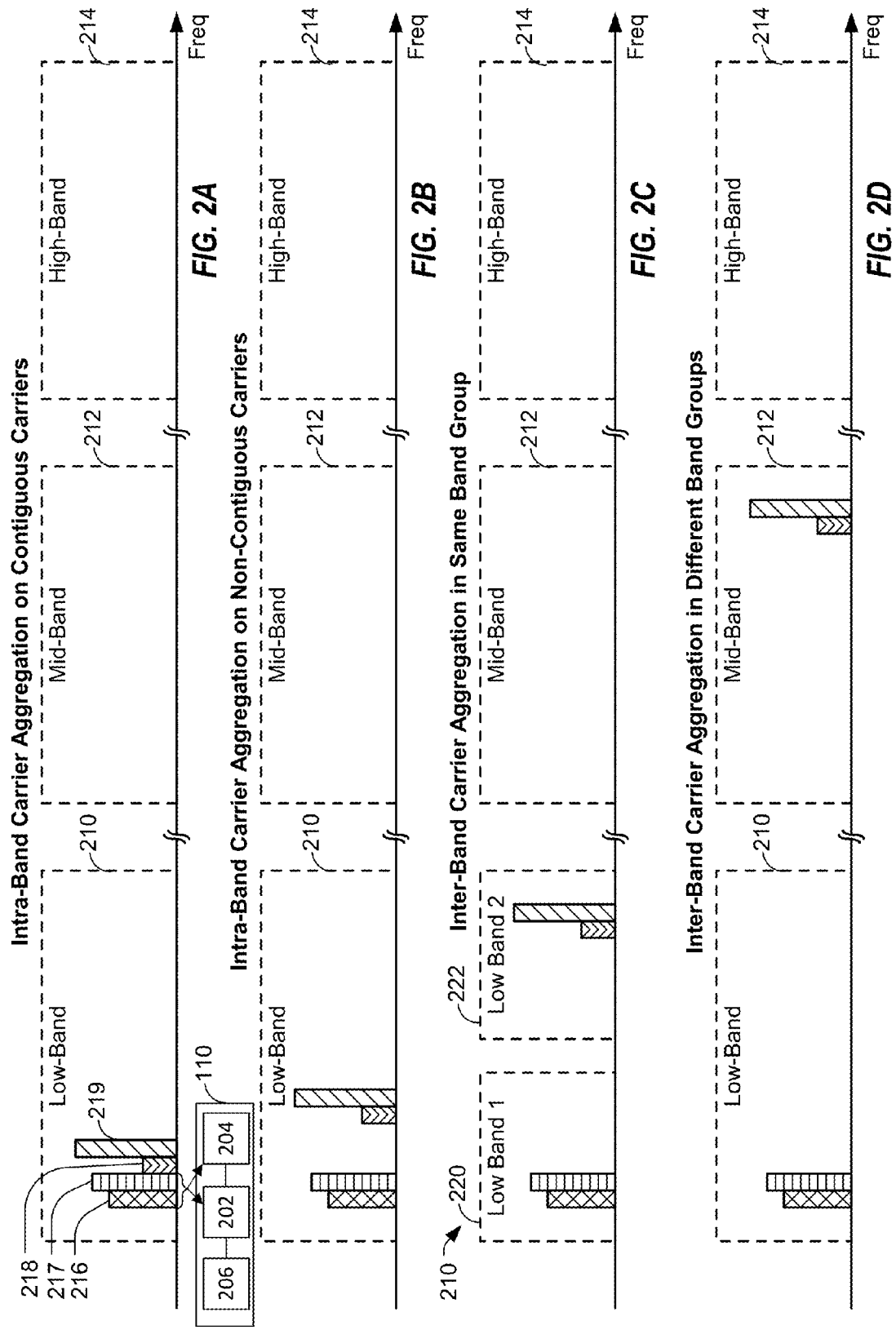
FIG. 2A is a graphical diagram showing an example of contiguous intra-band carrier-aggregation (CA) that may be used by the wireless device of FIG. 1.
FIG. 2B is a graphical diagram showing an example of non-contiguous intra-band CA that may be used by the wireless device of FIG. 1.
FIG. 2C is a graphical diagram showing an example of inter-band CA in the same band group that may be used by the wireless device of FIG. 1.
FIG. 2D is a graphical diagram showing an example of inter-band CA in different band groups that may be used by the wireless device of FIG. 1.

FIG. 4 illustrates an exemplary embodiment of an amplifier, such as an LNA 410, and transformer circuit 400 that may be incorporated in a wireless device, such as the wireless device 110 of FIGS. 1-2. The LNA 410 may correspond to the LNA 352 of FIG. 3. The LNA 410 includes a first amplifier stage, such as a main LNA 412, that may correspond to the first amplifier stage 202 of FIGS. 2-3. The LNA 410 also includes a second amplifier stage 404, such as an auxiliary LNA 414, that may correspond to the second amplifier stage 204 of FIGS. 2-3. The LNA 410 is configured to receive a radio frequency (RF) input signal (RF_in) via a connection 416 (e.g., from the duplexer or switch 346 of FIG. 3). The main LNA 412 is coupled to ground via a degeneration circuit (e.g., a degeneration inductor 432), and the auxiliary LNA 414 is directly coupled to ground. The LNA 410 also includes a resistive-capacitive (RC) network 450, such as the RC network 206 of FIGS. 2-3, coupled to an input node 418. The RC network 450 includes a resistive element (e.g., a resistor 453) and a switching device, such as a transistor 452, that is coupled to the resistive element and to at least one impedance element (e.g., a capacitor 454). The resistive element and the at least one impedance element are configured to provide input impedance matching to the auxiliary LNA 414 when the main LNA 412 is disabled.

An input matching circuit 425 is coupled between the connection 416 and the input node 418. The input matching circuit 425 may be configured to provide input impedance matching during operation of the main LNA 412 in a carrier aggregation mode and in a non-carrier aggregation mode. Because the auxiliary LNA 414 provides a high input impedance to the amplifier 410 (i.e., to the main LNA 412), the input matching circuit 425 may provide effective input impedance matching while the main LNA 412 is active independently of whether the auxiliary LNA 414 is active.

The first amplifier stage (e.g., the main LNA 412) is coupled to the input node 418 and configured to amplify a first carrier signal, and the second amplifier stage (e.g., the auxiliary LNA 414) is coupled to the input node 418 and configured to amplify a second carrier signal. For example, the auxiliary LNA 414 may be configured to amplify the second carrier signal to detect a paging signal in a dual-subscriber identity module (SIM) dual-standby (DSDS) operating mode. The main LNA 412 may be configured to provide a first gain and the auxiliary LNA 414 may be configured to provide a second gain that is different from the first gain.

The main LNA 412 comprises a main gain transistor 420, a first switch, such as a first cascode transistor 424, and a second switch, such as a second cascode transistor 426. The source of the main gain transistor 420 is coupled to a degeneration inductor 432. The degeneration inductor 432 provides source degeneration for the main gain transistor 420. The drain of the main gain transistor 420 is coupled to the source of the first cascode transistor 424 and to the source of the second cascode transistor 426. The drain of the first cascode transistor 424 is coupled to a first load circuit, such as a first transformer 462.

In an exemplary embodiment, the first transformer 462 is configured to convert a single ended CA1 RF output signal (CA1_RFout) from the drain of the first cascode transistor 424 to a differential signal output provided to a first downconverter (not shown). The drain of the second cascode transistor 426 is coupled to a second load circuit, such as a second transformer 464. In an exemplary embodiment, the second transformer 464 is configured to convert a single ended CA2 RF output signal (CA2_RFout) from the drain of the second cascode transistor 426 to a differential signal output provided to a second downconverter (not shown).

In an exemplary embodiment, the main LNA 412 can be configured to present a low input impedance (LZ) (for example, on the order of 50 ohms) to a radio frequency (RF) input signal on the connection 416. In an exemplary embodiment, the first cascode transistor 424 is responsive to an enable signal, main_ena_CA1, on its gate and the second cascode transistor 426 is responsive to an enable signal, main_ena_CA2, on its gate. The separate cascode transistors 424 and 426 can be referred to as a "split cascode" architecture to support CA and non-CA function. In an exemplary embodiment, the CA1 and CA2 signals are assumed to be balanced with respect to power level.

A capacitor (Cgs) 425 may be an external capacitor and may couple the gate of the main gain transistor 420 to the source of the main gain transistor 420. In an exemplary embodiment, the capacitance of Cgs 425 may be made configurable to provide for "optimum" or otherwise improved input matching of the LNA 410 to the input signal RFin. For example, Cgs 425 may be programmed to a first value when the LNA 410 is configured to amplify a signal in a first frequency band and to a second value when the LNA 410 is configured to amplify a signal in a second frequency band. For example, Cgs 425 may include multiple capacitive elements that may be selectively coupled to or decoupled from the gate of the main gain transistor 420 to set Cgs 425 to a particular capacitance.

The auxiliary LNA 414 comprises an auxiliary gain transistor 430, a third switch, such as a first auxiliary cascode transistor 434, and a fourth switch, such as a second auxiliary cascode transistor 436. The source of the auxiliary gain transistor 430 is coupled to ground. The drain of the auxiliary gain transistor 430 is coupled to the source of the first auxiliary cascode transistor 434 and to the source of the second auxiliary cascode transistor 436. The drain of the first auxiliary cascode transistor 434 is coupled to the first transformer 462. In an exemplary aspect, the first auxiliary cascode transistor 434 is responsive to an enable signal, aux_ena_CA1, at its gate and the second auxiliary cascode transistor 436 is responsive to an enable signal, aux_ena_CA2, at its gate.

In an exemplary embodiment, the first transformer 462 is configured to convert a single ended CA1 RF output signal (CA1_RFout) from the drain of the first auxiliary cascode transistor 434 to a differential signal output provided to the first downconverter (not shown). The drain of the second auxiliary cascode transistor 436 is coupled to the second transformer 464. In an exemplary embodiment, the second transformer 464 is configured to convert a single ended CA2 RF output signal (CA2_RFout) from the drain of the second auxiliary cascode transistor 436 to a differential signal output provided to a second downconverter (not shown). A capacitive device, illustrated as an alternating-current (AC) coupling capacitor 419, may be configured to provide AC coupling between the input of the main LNA 412 and the input of the auxiliary LNA 414. The AC coupling capacitor 419 may be coupled between the gate of the auxiliary gain transistor 430 and the input node 418.

A first bias circuit may be coupled to an input of the first amplifier stage. For example, a bias voltage, V_bias_main, is provided from connection 411 through a bias resistor 413, R_bias_main, to the gate of the first gain transistor 420. A second bias circuit may be coupled to an input of the second amplifier stage. For example, a bias voltage, V_bias_aux, is provided from connection 415 through a bias resistor 417, R_bias_aux, to the gate of the auxiliary gain transistor 430.

In an exemplary embodiment, the main gain transistor 420 and the auxiliary gain transistor 430 can be enabled along with various combinations of the first cascode transistor 424, the second cascode transistor 426, the first auxiliary cascode transistor 434, and the second auxiliary cascode transistor 436 to provide intra-CA and inter-CA signal outputs CA1 and CA2 to the first transformer 462 and to the second transformer 464. The main gain transistor 420 can be enabled along with either or both of the first cascode transistor 424 and the second cascode transistor 426 to provide only one carrier or both CA1 and CA2 outputs. However, in a mode in which the auxiliary gain transistor 430 is used to monitor for a paging signal in the DSDS operating mode, operating the auxiliary gain transistor 430 without operating the main gain transistor 420 can cause an input impedance mismatch that could impede amplification of the paging signal. Therefore, to avoid activating the main gain transistor 420 in such a mode, the auxiliary matching circuit (i.e., the RC network 450) can be coupled to the gate of the main gain transistor 420 and the gate of the auxiliary gain transistor 430 through the AC coupling capacitor 419.

The RC network 450 is configured to operate as an auxiliary matching circuit and includes a resistive device (e.g., the resistor 453) and at least one impedance element that includes a capacitive element (e.g., the capacitor 454) coupled to a switching device (e.g., the transistor 452) and to ground. The switching device is coupled to the input node 418 via the resistive device. For example, the resistive device (e.g., the resistor 453), the switching device (e.g., the transistor 452), and the capacitive device (e.g., the capacitor 454) may be serially coupled between the input node 418 and ground. The RC network 450 includes the switching device coupled to the capacitive device (the capacitor 454), and the switching device is responsive to a control input (e.g., a signal aux_alone_en) to couple the capacitive device to the input node 418 when the auxiliary LNA 414 is enabled while the main LNA 412 is disabled. The switching device may be configured to modify an impedance of the second amplifier stage (the auxiliary LNA 414), based on whether the first amplifier stage (the main LNA 412) is enabled, by coupling the capacitive device to the input node 418 when the main LNA 412 is disabled and decoupling the capacitive device from the input node 418 when the main LNA 412 is enabled.

In an exemplary embodiment, the auxiliary matching circuit (the RC network 450) comprises the transistor 452 having its gate coupled to an enable signal, aux_alone_en, on connection 458 through a resistor 456. The source of the transistor 452 is coupled to ground through the capacitor 454. The drain of the transistor 452 is coupled to the resistor 453, which is coupled to the input node 418. When the transistor 452 is enabled, the resistor 453 and the capacitor 454 create an input impedance matching network at the gate of the auxiliary gain transistor 430.

The transistor 452 is responsive to the control input (e.g., the signal aux_alone_en) to adjust an impedance of the auxiliary LNA 414 based on whether the main amplifier 412 is enabled. In an exemplary embodiment, the transistor 452 is enabled by the signal, aux_alone_en, when the auxiliary gain transistor 430 is operating without the main gain transistor 420 being enabled.

When operating in a mode in which the main gain transistor 420 is on and the auxiliary gain transistor 430 is off, either or both of the first cascode transistor 424 is enabled by the main_ena_CA1 signal and/or the second cascode transistor 426 is enabled by the main_ena_CA2 signal.

The LNA 410 may be configurable to enable the auxiliary LNA 414 independent of whether the primary LNA 412 is enabled or disabled. For example, the LNA 410 may be configured to operate in a first mode in which the main LNA 412 and the auxiliary LNA 414 are enabled and to operate in a second mode in which the auxiliary LNA 414 is enabled while the main LNA 412 is disabled. When operating in a mode in which the main gain transistor 420 is on and the auxiliary gain transistor 430 is on (e.g., receiving a paging signal using one of the carriers while the other carrier is active), either the first cascode transistor 424 is enabled by the main_ena_CA1 signal or the second cascode transistor 426 is enabled by the main_ena_CA2 signal. In addition, either the first auxiliary cascode transistor 434 is enabled by the aux_ena_CA1 signal or the second auxiliary cascode transistor 436 is enabled by the aux_ena_CA2 signal. When operating in a mode in which the main gain transistor 420 is off and the auxiliary gain transistor 430 is on (e.g., receiving a paging signal using one of the carriers while the other carrier is not active), the transistor 452 is enabled by the aux_alone_en signal on connection 458, and either or both of the first auxiliary cascode transistor 434 is enabled by the aux_ena_CA1 signal and/or the second auxiliary cascode transistor 436 is enabled by the aux_ena_CA2 signal. In this manner, the auxiliary matching circuit 450 provides input impedance matching to the auxiliary gain transistor 430, allowing the auxiliary gain transistor 430 to be on while the main gain transistor 420 is off. Operating the auxiliary gain transistor 430 while the main gain transistor 420 is off reduces overall power consumption at the LNA 410.

Figure 5:
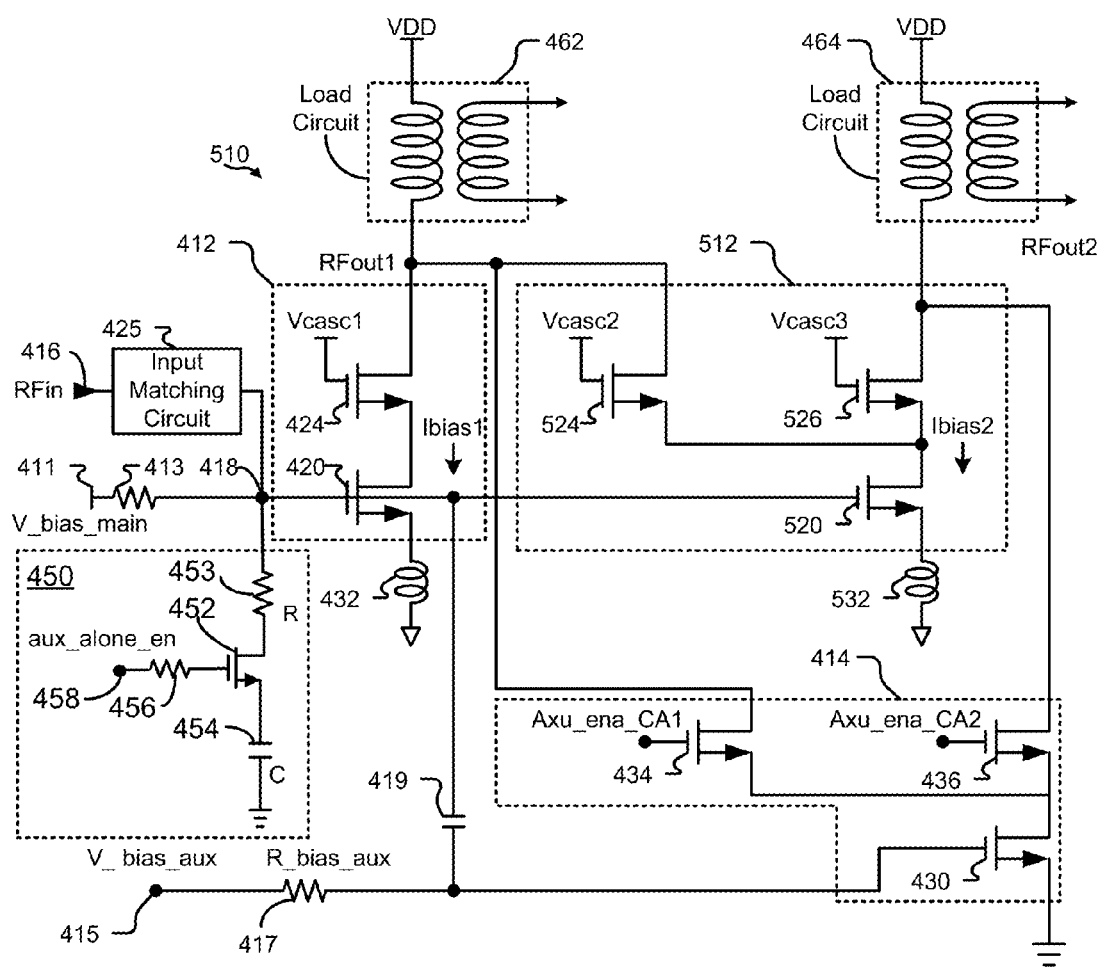
FIG. 5 illustrates another exemplary embodiment of an amplifier that may be included in the wireless device of FIG. 1.

FIG. 5 illustrates another exemplary embodiment of a system that includes an amplifier 510 that includes some components previously described with respect to FIG. 4, such as the RC network 450. The amplifier 510 includes the main LNA 412 coupled to ground via the degeneration inductor 432. The main LNA 412 and the auxiliary LNA 414 are coupled to the load circuits 462, 464. The first bias circuit, including the connection 411 and the bias resistor 413, is coupled to the gate of the first gain transistor 420. The second bias circuit, including the connection 415 and the bias resistor 417, is coupled to the gate of the auxiliary gain transistor 430.

The amplifier 510 also includes a second main amplifier stage, such as a second main LNA 512. The second main LNA 512 includes a gain transistor 520 that is selectively coupled to the first load circuit 462 via a cascode transistor 524 (a "divert" transistor) and that is selectively coupled to the second load circuit 464 via a cascode transistor 526. The gate of the gain transistor 520 may be direct-current (DC) coupled to the gate of the gain transistor 520 of the main LNA 412. The source of the gain transistor 520 is coupled to ground via a degeneration transistor 532.

The main LNA 412 and the second main LNA 512 may be configured to operate in a carrier aggregation mode in which the main LNA 412 is coupled to the first load circuit 462, the second main LNA 512 is coupled to the second load circuit 464, and the divert transistor 524 is deactivated to block (or reduce) current flow between the main LNA 412 and the second main LNA 512. The main LNA 412 and the second main LNA 512 may be configured to operate in a non-carrier aggregation mode in which the divert transistor 524 is activated and the cascode transistor 526 is deactivated so that that the main LNA 412 and the second main LNA 512 are coupled in parallel to the first load circuit 462.

An input signal RFin at the connection 416 is provided to the input node 418 via the input matching circuit 425. The input matching circuit 425 may be configured to provide input impedance matching during operation of the main LNA 412 and the second main LNA 512 in the carrier aggregation mode and in the non-carrier aggregation mode. Because the auxiliary LNA 414 provides a high input impedance to the amplifier 510 (i.e., to the main LNA 412 and to the second main LNA 512), the input matching circuit 425 may provide effective input impedance matching while the main LNA 412 and/or the second main LNA 512 are active independently of whether the auxiliary LNA 414 is active.

In an operating mode in which the main LNA 412 and the second main LNA 512 are inactive (disabled) while the auxiliary LNA 414 is active, the transistor 452 of the auxiliary matching circuit 450 is enabled by the aux_alone_en signal, at connection 458, and either or both of the first auxiliary cascode transistor 434 is enabled by the aux_ena_CA1 signal and/or the second auxiliary cascode transistor 436 is enabled by the aux_ena_CA2 signal. In this manner, the auxiliary matching circuit 450 provides input impedance matching to the auxiliary gain transistor 430, allowing the auxiliary gain transistor 430 to be on while the main gain transistors 420 and 520 are off. Thus, the input impedance may be modified based on an operating mode of the amplifier 510 having more than two amplification stages that may support different amplifier gains in a DSDS configuration.

Figure 6:
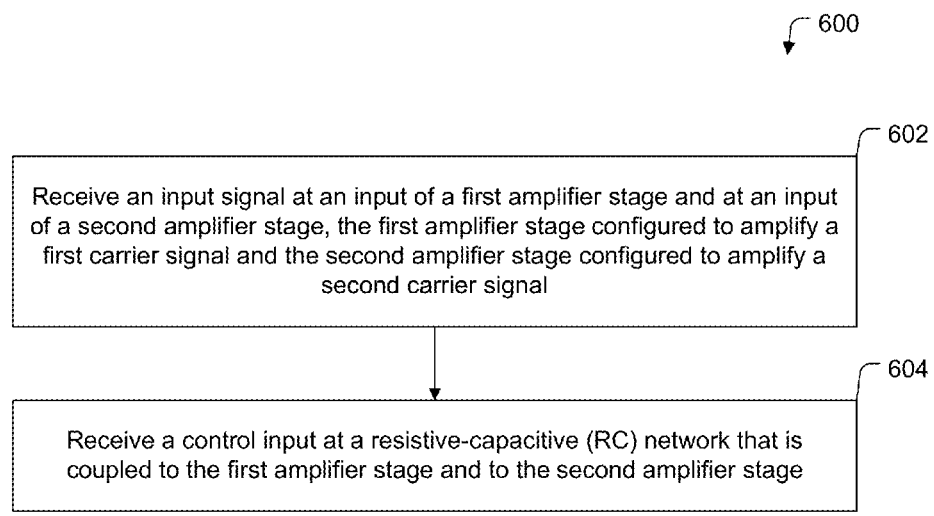
FIG. 6 illustrates an exemplary embodiment of a method that may be performed in the wireless device of FIG. 1.

Referring to FIG. 6, an exemplary embodiment of a method is depicted and generally designated 600. The method 600 may be performed in a wireless device that includes an amplifier with multiple amplification stages and an RC matching network, such as the wireless device 110 of FIG. 1 that includes the LNA 410 of FIG. 4 or the amplifier 510 of FIG. 5. For example, the method 600 may be performed by the LNA 410 of FIG. 4 or by the amplifier 510 of FIG. 5.

The method 600 includes receiving an input signal at an input of a first amplifier stage and at an input of a second amplifier stage, at 602. The first amplifier stage may be configured to amplify a first carrier signal and the second amplifier stage may be configured to amplify a second carrier signal. For example, the input signal may be received at the input node 418 of FIG. 4 or FIG. 5. The first amplifier stage may correspond to the main LNA 412 of FIG. 4 or FIG. 5 or the second LNA 512 of FIG. 5, as illustrative, non-limiting examples. To illustrate, the input signal may be an RF signal that is received from the antenna 348 of FIG. 3 via the duplexer or switch 346.

A control input is received at a resistive-capacitive (RC) network that is coupled to the first amplifier stage and coupled to the second amplifier stage, at 604. For example, the control input may correspond to the enable signal (aux_alone_en) provided on connection 458 via the resistor 456 to the transistor 452 of FIGS. 4-5. The control input may be selected, generated, or otherwise provided by a control circuit, such as by the data processor 310 of FIG. 3, based on a mode of operation of the amplifier.

For example, the amplifier may operate in a dual-subscriber identity module (SIM) dual-standby (DSDS) operating mode. In the DSDS mode, the first amplifier stage may be a main amplifier stage that is configured to amplify a first carrier signal when the first amplifier stage is enabled. When the first carrier signal does not include a main receive signal, the first amplifier stage may be disabled. The second amplifier stage may correspond to an auxiliary amplifier stage that is configured to amplify a second carrier signal to detect a paging signal. The control input may cause the switching device to de-couple at least one impedance element of the RC network, such as by blocking current through the resistor 453, from the input node during operation in a mode in which the first amplifier stage is enabled. The control input may cause the switching device to couple the at least one impedance element (e.g., the capacitor 454) to the input node during operation in a mode in which the first amplifier stage is disabled to provide input impedance matching for the second amplifier stage.

The method 600 enables operation of multiple amplification stages that may provide independently controllable gain levels to their respective carrier signals. Various operating modes, such as a DSDS mode, may be supported using a single that reduces power consumption by disabling a first amplifier stage while a second amplifier stage remains enabled for DSDS paging signals. As a result, power consumption of the amplifier may be reduced as compared to amplifiers that keep a first amplifier stage on to provide input impedance matching for the second amplifier stage when no receive signal for the first amplifier stage is present, such as in a DSDS paging mode.

Although FIG. 6 depicts a particular order of elements of the method 600, it should be understood that, in other embodiments, elements of the method 600 may be performed in another order or may be performed simultaneously or substantially simultaneously. For example, the input signal may be provided to the inputs of the first and second amplifier stages (at 602) simultaneously with (or substantially simultaneously with) the control signal being provided to the switching device (at 604).

In conjunction with the disclosed embodiments, an apparatus is described that includes first means for amplifying a first carrier signal. For example, the first means for amplifying may include the first amplifier stage 202 of FIG. 2 or FIG. 3, the main LNA 412 of FIG. 4 or FIG. 5, the second LNA 512 of FIG. 5, one or more other amplifier circuits, or any combination thereof.

The apparatus includes second means for amplifying a second carrier signal. For example, the second means for amplifying may include the second amplifier stage 204 of FIG. 2 or FIG. 3, the auxiliary LNA 414 of FIG. 4 or FIG. 5, one or more other amplifier circuits, or any combination thereof.

The apparatus may include means for providing an RC impedance, the means for providing the RC impedance coupled to the first means for amplifying and coupled to the second means for amplifying. The means for providing the RC impedance may include a resistive-capacitive (RC) network, the RC network including a resistor and a capacitor that are serially coupled between the input node and ground. For example, the means for providing an RC impedance may include the RC network 206 of FIG. 2 or FIG. 3, the RC network 450 of FIGS. 4-5, one or more other switching devices (e.g., transistor, switching diode, etc.), or any combination thereof.

The apparatus may also include first means for biasing coupled to the first means for amplifying and second means for biasing coupled to the second means for amplifying. For example, the first means for biasing may include the connection 411 of FIG. 4 or FIG. 5, the bias resistor 413 of FIG. 4 or FIG. 5, another node, connection, voltage source, or other circuit element to provide a voltage bias, or any combination thereof. As another example, the second means for biasing may include the connection 415 of FIG. 4 or FIG. 5, the bias resistor 417 of FIG. 4 or FIG. 5, another node, connection, voltage source, or other circuit element to provide a voltage bias, or any combination thereof.

The apparatus may also include means for providing alternating-current (AC) coupling between an input of the first means for amplifying and an input of the second means for amplifying. For example, the means for providing AC coupling may include the AC coupling capacitor 419 of FIG. 4 or FIG. 5, one or more other capacitive circuit elements, or any combination thereof.

The amplifier with the RC matching network described herein may be used for dual SIM dual standby (DSDS) operation and may be implemented on one or more ICs, analog ICs, RFICs, mixed-signal ICs, ASICs, printed circuit boards (PCBs), electronic devices, etc. The amplifier with the RC matching network may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifier with the RC matching network described herein may be used for dual SIM dual standby (DSDS) operation and may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored as one or more instructions or code on a computer-readable medium. Computer-readable media includes both computer storage media and communication media including any medium that facilitates transfer of a computer program from one place to another. A storage media may be any available media that can be accessed by a computer. In an exemplary embodiment, a storage device stores data in a form that is not a transient or propagating signal, such as based on an optical reflectivity or magnetic orientation of a physical storage material, an amount of charge stored on a floating gate of a transistor or on a plate of a capacitor, etc. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. To illustrate, the data processor 310 of FIG. 3 may execute program instructions to select values of the control signal "aux_alone_en" of FIG. 4 or FIG. 5, to select values of control signals to control the switches 424, 426, 434, and 436 of FIG. 4, and/or to set values of control signals to control the switches 424, 524, and 426 of FIG. 5. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. An apparatus comprising:
   a first amplifier stage configured to amplify a first carrier signal;
   a second amplifier stage configured to amplify a second carrier signal, wherein the second amplifier stage is configured to amplify the second carrier signal to detect a paging signal; and
   a resistive-capacitive (RC) network, the RC network including a first terminal coupled to the first amplifier stage and coupled to the second amplifier stage and a second terminal coupled to ground, the RC network including a resistive element coupled to a capacitive element.

2. The apparatus of claim 1, further comprising a first load circuit and a second load circuit, wherein the first amplifier stage includes a first switch coupled to the first load circuit and a second switch coupled to the second load circuit.

3. The apparatus of claim 2, wherein the second amplifier stage includes a third switch coupled to the first load circuit and a fourth switch coupled to the second load circuit.

4. The apparatus of claim 1, wherein the first amplifier stage is configured to support a carrier aggregation operating mode, and wherein the second amplifier stage is configured to amplify the second carrier signal to detect the paging signal in a dual-subscriber identity module (SIM) dual-standby (DSDS) operating mode.

5. The apparatus of claim 1, wherein the RC network further includes a third terminal configured to receive a control input.

6. The apparatus of claim 1, wherein the RC network further includes a switching device, wherein the capacitive element is coupled to the switching device and to ground, and wherein the switching device is responsive to a control input and is configured to modify an impedance of the second amplifier stage based on whether the first amplifier stage is enabled.

7. The apparatus of claim 1, wherein the first amplifier stage and the second amplifier stage are included in a low noise amplifier (LNA), and wherein the LNA is configurable to enable the second amplifier stage independent of whether the first amplifier stage is enabled.

8. The apparatus of claim 1, wherein the first amplifier stage and the second amplifier stage are included in a low noise amplifier (LNA) that is configured to operate in a first mode in which the first amplifier stage and the second amplifier stage are enabled and to operate in a second mode in which the second amplifier stage is enabled while the first amplifier stage is disabled.

9. The apparatus of claim 1, wherein the second terminal is coupled to ground via a path that is independent of the first amplifier stage and the second amplifier stage.

10. The apparatus of claim 1, further comprising a capacitor that provides alternating-current (AC) coupling between an input of the first amplifier stage and an input of the second amplifier stage.

11. The apparatus of claim 1, further comprising a first bias circuit coupled to the first amplifier stage and a second bias circuit coupled to the second amplifier stage.

12. The apparatus of claim 1, wherein the first amplifier stage is configured to provide a first gain and wherein the second amplifier stage is configured to provide a second gain that is different from the first gain.

13. The apparatus of claim 1, wherein the first amplifier stage is coupled to ground via a degeneration circuit and wherein the second amplifier stage is directly coupled to ground.

14. The apparatus of claim 1, wherein the second terminal is directly coupled to ground.

15. The apparatus of claim 1, further comprising a switching device, wherein the resistive element is coupled via the switching device to the capacitive element.

16. An apparatus comprising:
first means for amplifying a first carrier signal;
second means for amplifying a second carrier signal, wherein the second means for amplifying is configured to amplify the second carrier signal to detect a paging signal; and
means for providing a resistive-capacitive (RC) impedance, the means for providing the RC impedance including a first terminal coupled to the first means for amplifying and coupled to the second means for amplifying and a second terminal coupled to ground.

17. The apparatus of claim 16, wherein the capacitive element is coupled to ground, and wherein the means for providing the RC impedance further includes a third terminal configured to receive a control input, and further comprising means for providing alternating-current (AC) coupling between an input of the first means for amplifying and an input of the second means for amplifying.

18. The apparatus of claim 16, wherein the first means for amplifying is configured to support a carrier aggregation operating mode, and wherein the second means for amplifying is configured to amplify the second carrier signal to detect the paging signal in a dual-subscriber identity module (SIM) dual-standby (DSDS) operating mode.

19. The apparatus of claim 16, further comprising:
first means for biasing coupled to the first means for amplifying; and
second means for biasing coupled to the second means for amplifying.

20. A method comprising:
receiving an input signal at an input of a first amplifier stage of an amplifier and at an input of a second amplifier stage of the amplifier, the first amplifier stage configured to amplify a first carrier signal and the second amplifier stage configured to amplify a second carrier signal; and
receiving a control input at a resistive-capacitive (RC) network including a first terminal that is coupled to the first amplifier stage and coupled to the second amplifier stage and a second terminal that is coupled to ground; and
operating the amplifier in a dual-subscriber identity module (SIM) dual-standby (DSDS) operating mode at least in part by:
amplifying, by the first amplifier stage, the first carrier signal when the first amplifier stage is enabled; and
amplifying, by the second amplifier stage, the second carrier signal to detect a paging signal.

* * * * *